(12) United States Patent
Roy

(10) Patent No.: US 6,579,782 B2
(45) Date of Patent: Jun. 17, 2003

(54) VERTICAL POWER COMPONENT MANUFACTURING METHOD

(75) Inventor: Mathieu Roy, Joue Les Tours (FR)

(73) Assignee: STMicroelectronics S.A., Gentilly (FR)

( * ) Notice: Subject to any disclaimer, the term of this patent is extended or adjusted under 35 U.S.C. 154(b) by 133 days.

(21) Appl. No.: 09/747,757

(22) Filed: Dec. 22, 2000

(65) Prior Publication Data

US 2001/0011717 A1 Aug. 9, 2001

(30) Foreign Application Priority Data

Dec. 24, 1999 (FR) ............................................. 99 16487

(51) Int. Cl.[7] .......................... H01L 21/22; H01L 21/38; H01L 21/336
(52) U.S. Cl. ........................ 438/561; 438/545; 438/546; 438/549; 438/268
(58) Field of Search ................................ 438/545, 546, 438/549, 552, 560, 561, 268–274, 759

(56) References Cited

U.S. PATENT DOCUMENTS

| 5,366,914 | A | * | 11/1994 | Takahashi et al. ............ 437/41 |
| 6,228,750 | B1 | * | 5/2001 | Shibib ........................ 438/558 |
| 6,255,190 | B1 | * | 7/2001 | Kroner ....................... 438/424 |

FOREIGN PATENT DOCUMENTS

| EP | 0 063 416 A1 | 10/1982 |
| EP | 0 082 419 A2 | 6/1983 |
| EP | 0 997 931 A | 5/2000 |
| FR | 2 410 363 A | 6/1979 |
| JP | 54059887 A | * 5/1979 |
| JP | 62179128 A | * 8/1987 |
| JP | 02071546 A | * 3/1990 |
| JP | 02184026 A | * 7/1990 |

OTHER PUBLICATIONS

European Search Report from corresponding European application No. 00 41 0162.

Patent Abstracts of Japan vol. 014, No. 457 (E–0986), Oct. 2, 1990 and JP 02 184026 A Jul. 18, 1990.

* cited by examiner

Primary Examiner—John F. Niebling
Assistant Examiner—Viktor Simkovla
(74) Attorney, Agent, or Firm—Wolf, Greenfield & Sacks P.C.; James H. Morris; William R. McClellan

(57) ABSTRACT

A method for manufacturing a vertical power component on a substrate formed of a lightly-doped silicon wafer, including the steps of boring on the lower surface side of the substrate a succession of holes perpendicular to this surface; diffusing a dopant from the holes, of a second conductivity type opposite to that of the substrate; and boring similar holes on the upper surface side of the substrate to define an isolating wall and diffuse from these holes a dopant of the second conductivity type with a high doping level, the holes corresponding to the isolating wall being sufficiently close for the diffused areas to join laterally and vertically.

10 Claims, 2 Drawing Sheets

VERTICAL POWER COMPONENT MANUFACTURING METHOD

BACKGROUND OF THE INVENTION

1. Field of the Invention

The present invention relates to vertical type power components capable of withstanding high voltages.

2. Discussion of the Related Art

FIG. 1 is a very simplified cross-section view illustrating the general construction of a conventional power component. This component is formed in a large silicon wafer and is surrounded at its external periphery with an isolating wall of a conductivity type opposite to that of the substrate. This isolating wall is intended to separate the component from other components of the same chip, or for creating an electrically inactive protection area at the border of a chip, where a cutting is performed with respect to a neighboring chip. More specifically, referring to FIG. 1, starting from an N-type substrate 1, a first manufacturing operation consists of forming, from the upper and lower surfaces of this substrate, drive-in regions 2 and 3 that join to form the isolating wall.

For practical reasons, the wafers cannot have thicknesses under 200 $\mu$m. Under this threshold, they would be likely to break easily in handling associated with manufacturing. Thus, each of drive-ins 2 and 3 must penetrate into the wafer by some hundred $\mu$m, for example, 125 $\mu$m for a wafer of a thickness from 210 to 240 $\mu$m, to ascertain that a continuous wall, sufficiently doped at the level of its median portion, is formed. This implies very long diffusions at high temperatures, for example 300 hours at 1280° C. Clearly, this operation must be performed on a silicon wafer before any other doping operation on this wafer. Otherwise, during this long thermal processing time, the implantations previously performed in the substrate would diffuse too deeply.

After forming the isolating walls, doped regions intended for forming the desired vertical component, for example, as shown in FIG. 1, a thyristor, are formed. For this purpose, a P-type region 4 corresponding to the thyristor anode may be formed on the entire lower substrate surface, simultaneously with a P-type region 5 corresponding to the cathode gate region of this thyristor, on a portion of the upper substrate surface. Then, on the upper surface side, an N+ diffusion is performed to form in region 5 a cathode region 6 and possibly, between region 5 and isolating wall 2, a peripheral channel stop ring 7.

As seen previously, the total thickness of the wafer is determined by manufacturing considerations, which are essentially mechanical. Further, the characteristics of P-type regions 4 and 5 are determined by the desired electric characteristics of the thyristor. Indeed, it is for example desired to have a sufficiently steep doping front between each of regions 4 and 5 and substrate 1 to improve the characteristics of the corresponding junctions, and especially to obtain a good injection characteristic of the PNP transistor at the level of the junction between substrate 1 and region 4, but not too steep to obtain a sufficiently fast component.

Thus, in the case of the shown thyristor, if each of diffusions 4 and 5 has a depth on the order of 40 $\mu$m, and if the wafer has a 210-$\mu$m thickness, there will remain between P-N junctions 5-1 and 4-1 an area of substrate 1 having a 130-$\mu$m thickness. As is well known, this area of the substrate provides its off-state breakdown voltage characteristics to the power device. This area must thus be sufficiently thick. However, an excessive thickness of this area results in an increase of on-state losses of the power device. If a power device having a breakdown voltage on the order of 400 volts is desired to be obtained, it would be sufficient for the thickness of the region of substrate 1 to be on the order of 40 $\mu$m whereas, with the described manufacturing method, a thickness on the order of 130 $\mu$m is inevitably provided. No simple way of solving this problem is currently known. Indeed, increasing, for example, the thickness of layer 4 has the consequence that the junction profile of this layer risks not fulfilling the desired electric conditions. For example, if a thyristor such as shown in FIG. 2 is formed, in which the rear surface P region results from drive-in 3 that is used to form the lower isolating wall, a very progressive junction will be obtained and the thyristor characteristics will be rather unsatisfactory. Indeed, the substrate thickness that is involved to determine the on-state resistance no longer essentially is the thickness of N region 1, but also is a portion of the thickness of P region 3. Further, the breakdown voltage decreases.

More generally, the same problem is raised with any power device to be surrounded with an isolating wall, having a rear surface of a doping type opposite to that of a breakdown voltage substrate, for example a power transistor or an IGBT transistor.

A first solution to solve this problem has been described in a patent application bearing attorney docket number S 1022/8461, filed on Nov. 2, 2000, which is incorporated herein by reference and which describes a structure such as shown in FIG. 3.

On a relatively heavily-doped P-type substrate 10 is formed, by epitaxy, a lightly-doped N-type layer 11 intended for forming the breakdown voltage layer of a vertical power component, of which the P substrate forms the lower surface anode. An isolating wall is formed by forming a trench 13 substantially crossing the thickness of epitaxial layer 11 and surrounding the component, then filling the trench with heavily-doped P-type polysilicon and performing a thermal diffusion step.

The trench may be formed of openings sufficiently close to one another for diffused areas 14 laterally extending from these openings to join and form the isolating wall. The openings may, for example, have a diameter on the order of 1 to 5 $\mu$m and be distant from one another by 2 to 10 $\mu$m.

Then, diffusions intended for forming a desired component, for example a cathode gate diffusion 5 and cathode and channel stop ring diffusions 6 and 7 will be conventionally formed. Preferably, to improve the quality of the isolating wall, at the same time as P-type diffusion 5 is formed, a diffusion may be performed into areas 16 corresponding to the high portion of the isolating wall, to increase the doping level at the upper surface of the isolating wall.

A second isolating wall 17 may be formed outside the first one. A cutting may be performed between the two isolating walls distant, for example, by 100 $\mu$m, to separate two chips of a wafer.

The solution hereabove is not always satisfactory, since the doping gradient at the junction between substrate 10 and epitaxial layer 11 cannot be controlled. Further, this solution is not adapted to the more and more frequent case in which specific diffused areas are desired to be formed on the rear surface side.

SUMMARY OF THE INVENTION

Thus, an object of the present invention is to provide a novel method of manufacturing power components that improves or optimizes the thickness of the most lightly-doped breakdown voltage layer, avoiding the very long diffusion steps, and improving or optimizing the doping between anode and substrate.

The present invention also aims at a component obtained by the described method.

To achieve these and other objects, the present invention provides a method for manufacturing a vertical power component on a substrate formed of a lightly-doped silicon wafer, including the steps of boring on the lower surface side of the substrate a succession of holes perpendicular to this surface; diffusing a dopant from the holes into the substrate, of a second conductivity type opposite to that of the substrate; and boring similar holes on the upper surface side of the substrate to define an isolating wall and diffusing from these holes into the substrate a dopant of the second conductivity type with a high doping level, the holes corresponding to the isolating wall being sufficiently close for the diffused areas to join laterally and vertically.

According to an embodiment of the present invention, the dimensions of the openings and the dopant diffusion durations are such that the doped regions laterally extending from each opening are distant from one another by 10 to 30 μm.

According to an embodiment of the present invention, the openings have a diameter on the order of 5 μm and are distant from one another by approximately 20 to 50 μm.

The present invention also provides a vertical power component including a substrate formed of a lightly-doped silicon wafer of a first conductivity type opposite to that of lightly-doped breakdown voltage substrate, including on its lower surface side a succession of parallel holes perpendicular to this lower surface and filled with a dopant of the second conductivity type, and in which the component periphery is also bored on the upper surface side with holes filled with a dopant of the second conductivity type, the diffused areas joining at the component periphery.

The foregoing objects, features and advantages of the present invention, will be discussed in detail in the following non-limiting description of specific embodiments in connection with the accompanying drawings.

DETAILED DESCRIPTION

Figure 4:
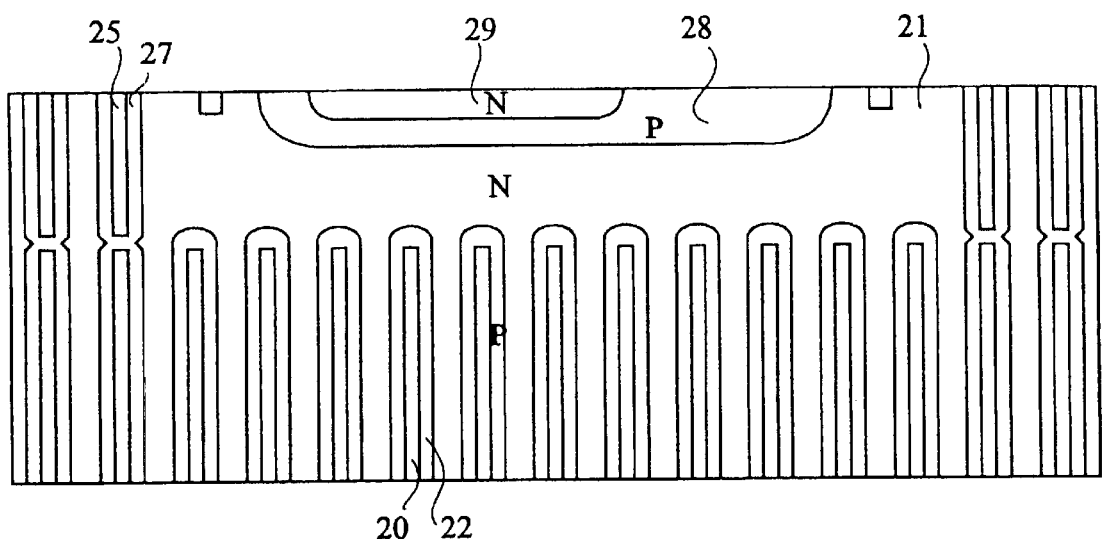
FIG. 4 is a simplified cross-section view of an example of a vertical power component obtained by the method according to the present invention.

FIG. 4 shows a simplified cross-section view of an example of a thyristor according to the present invention.

Figure 1:
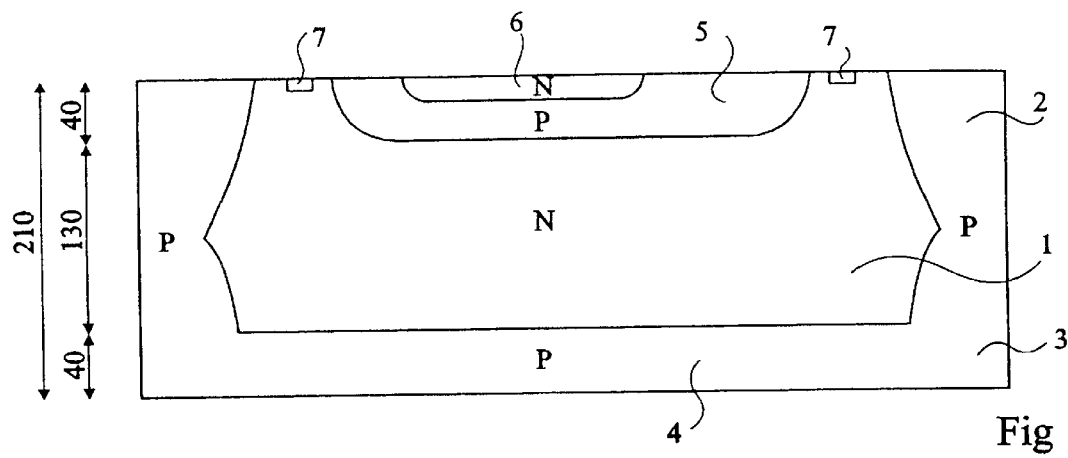
FIG. 1 is a simplified cross-section view of a vertical power component of conventional structure.
Figure 2:
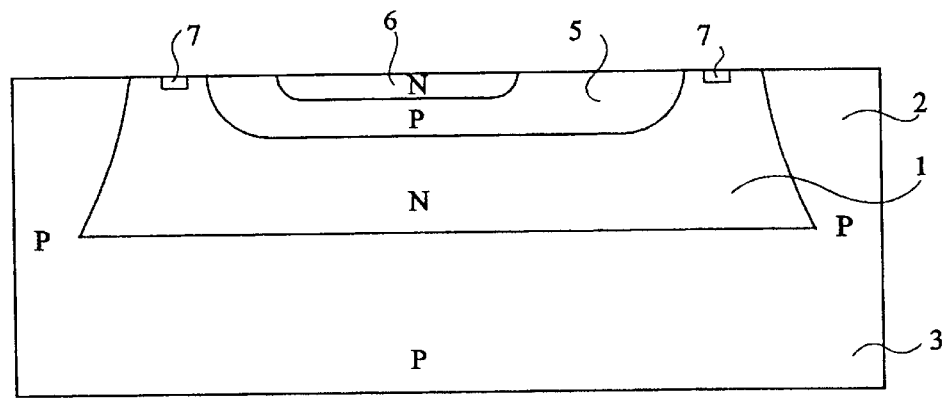
FIG. 2 is a simplified cross-section view of another example of a conventional vertical power component.
Figure 3:
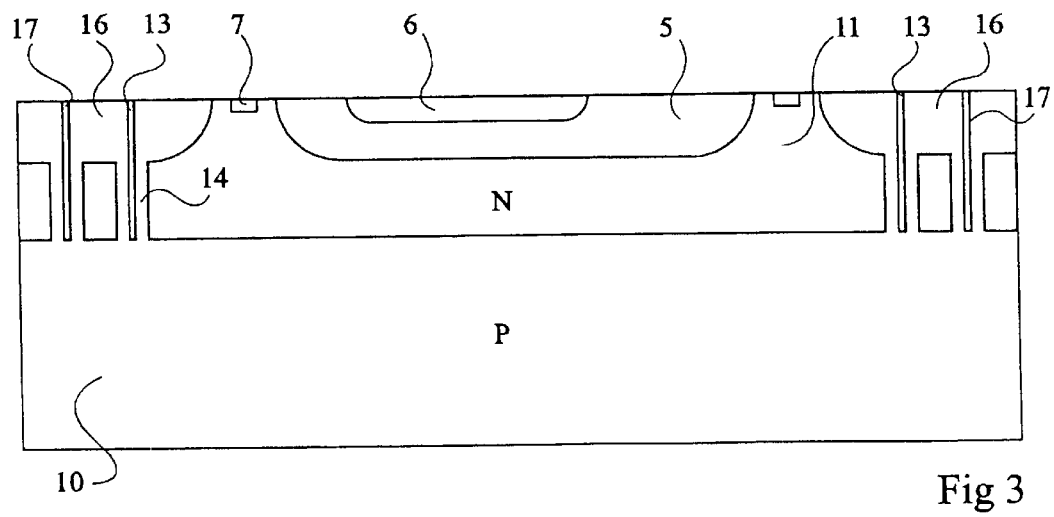
FIG. 3 is a simplified cross-section view of another example of a vertical power component.

This thyristor is formed from a lightly-doped N-type silicon wafer 21, similar to wafers 1 of FIGS. 1 and 2, and to wafer 11 of FIG. 3.

On the lower surface side of wafer 21 are formed many holes 20 having for example a diameter on the order of 5 μm.

A P-type dopant is made to diffuse from these holes to form around each hole a P-type doped ring 22. Conventionally, this doping may be performed by conformally depositing P-type doped polysilicon by chemical vapor deposition, to fill the holes, and by then annealing.

The device periphery is processed like the periphery described in relation with FIG. 3, by forming from the upper surface trenches or successions of holes 25 also filled with P-type polysilicon that diffuses to form peripheral areas 27. Diffused areas 27 on the upper surface side form a continuous contour and merge with the corresponding diffused areas formed from the lower surface side that form a corresponding continuous contour.

Various alternative borings and embodiments of the isolating walls will occur to those skilled in the art and some of them are already known in the art, and for example described in U.S. patent application Ser. No. 09/426,822, filed Oct. 22, 1999, which is incorporated herein by reference. Holes 20 may be formed as described in this application.

Also, on the upper surface side, a P-type region 28 has been formed that contains an N-type region 29. Thus, in the embodiment shown, a vertical thyristor has been obtained, the cathode of which corresponds to region 29 and the anode of which corresponds to P-type regions 22.

It should be noted that in practice, diffused regions 22 must not necessarily be contiguous since, when an intense inverse field is applied, the equipotential surfaces do not penetrate between the P-type doped fingers if those are sufficiently close to one another, by a self-shielding effect, in a way known by those skilled in the art.

The depth of holes 20 is chosen so that, after forming diffused areas 22, the vertical distance between the junction between regions 21 and 28 and the junctions between region 21 and regions 22 is adapted to the voltage that is desired to be withstood by the device.

It should be noted that the doping gradient at the junction depends on the doping and anneal conditions of the polysilicon contained in trenches 20. This doping can thus be optimized according to the desired aims.

The previously-described manufacturing method is particularly simple to implement as compared to prior methods, and especially to the method described in relation with FIG. 3 since the same technology (hole boring) is used to form the isolating walls and the anode regions.

Figure 5:
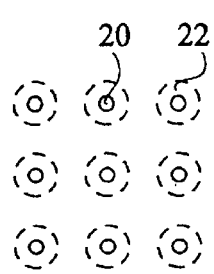
FIGS. 5 and 6 are partial bottom views of various examples of implementation of a vertical power component according to the present invention.
Figure 6:
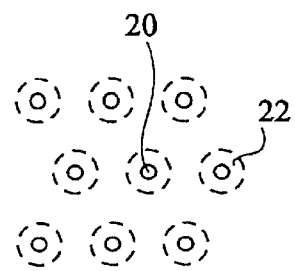

FIGS. 5 and 6 show examples of arrangement of holes 20 in bottom view. Those skilled in the art may choose any desired arrangement. As previously indicated, the distance between holes will be chosen so that areas 22 diffused from adjacent holes touch or not. The first configuration will be chosen in the isolating wall region.

A thyristor has been shown in FIG. 4 as an example, for simplification. Of course, the present invention will also apply to any other vertical-type power component structure having a rear surface of a type opposite to that of a breakdown voltage layer, and especially to structures of power transistor type and of insulated gate bipolar transistor (IGBT) type. In such structures, the present invention enables obtaining a breakdown voltage layer having exactly the desired thickness, that does not depend on technological constraints.

The durations necessary to the various diffusions will be extremely short with respect to the duration required for the vertical drive-in of the isolating walls described in relation with FIGS. 1 and 2.

Of course, the present invention is likely to have various alterations, modifications, and improvements which will readily occur to those skilled in the art. For example, a step of lapping the rear surface of the wafers after depositing the polysilicon layer filling holes 20 may be provided.

As another alternative, instead of providing neighboring holes on the lower surface side, trenches may be dug, although this solution is presently not preferred.

Furthermore, although the holes in the substrate are illustrated as being perpendicular to the surface of the substrate, the holes could also be disposed at any angle with respect to the surface of the substrate. In addition, although the holes in the substrate are illustrated as being parallel to each other, the holes could be disposed at any angle with respect to each other.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for manufacturing a vertical power component on a substrate formed of a wafer having a first doping level, including the steps of:

boring on a lower surface side of the substrate a succession of holes perpendicular to the lower surface side, wherein a first portion of the succession of holes is formed in a first region within the vertical power component and a second portion of the succession of holes is formed in a second region peripheral to the vertical power component;

diffusing a dopant from the holes of a second conductivity type opposite to that of the substrate; and boring similar holes on an upper surface side of the substrate to define an isolating wall and diffusing from these holes a dopant of the second conductivity type with a second doping level, the holes corresponding to the isolating wall being sufficiently close for diffused areas to join and vertically.

2. The method of claim 1, wherein dimensions of the holes and dopant diffusion durations are such that the diffused areas laterally extending from each hole are distant from one another by 10 to 30 µm.

3. The method of claim 2, wherein the holes have a diameter on the order of 5 µm and are distant from one another by approximately 20 to 50 µm.

4. A method of controlling operating characteristics of a vertical power component formed in a semiconductor substrate having a first conductivity type, the method including the steps of:

providing a first plurality of holes on a lower surface of the substrate;

depositing a dopant of a second conductivity type within the first plurality of holes;

diffusing the dopant from the first plurality of holes to form a first plurality of diffused areas, at least some of the first plurality of diffused areas forming an electrode of the vertical power component.

5. The method according to claim 4, wherein the first plurality of holes on the lower surface have a depth that determines, at least in part, a breakdown voltage of the vertical power component.

6. The method according to claim 4, further including the steps of:

providing a second plurality of holes on an upper surface of the substrate;

depositing a dopant of the second conductivity type within the second plurality of holes;

diffusing the dopant from the second plurality of holes to form a second plurality of diffused areas.

7. The method according to claim 6, wherein at least some of the first plurality of diffused areas are joined with at least some of the second plurality of diffused areas to form a plurality of joined diffused areas.

8. The method according to claim 7, wherein the joined diffused areas form a plurality of contiguous regions of the second conductivity type extending from the upper surface to the lower surface of the substrate.

9. A method for manufacturing a vertical power component on a substrate of a first conductivity type, comprising the steps of:

boring on a lower surface side of the substrate a succession of holes, wherein a portion of the succession of holes on the lower surface side is formed in the vertical power component;

diffusing from the holes a dopant of a second conductivity type opposite to that of the substrate; and boring holes on an upper surface side of the substrate to define an isolating wall and diffusing from these holes a dopant of the second conductivity type, the holes corresponding to the isolating wall being sufficiently close for diffused areas to join laterally and vertically.

10. The method of claim 1, wherein the second doping level is greater than the first doping level.

\* \* \* \* \*

UNITED STATES PATENT AND TRADEMARK OFFICE
CERTIFICATE OF CORRECTION

PATENT NO. : 6,579,782 B2
DATED : June 17, 2003
INVENTOR(S) : Mathieu Roy

It is certified that error appears in the above-identified patent and that said Letters Patent is hereby corrected as shown below:

Column 5,
Line 40, should read:
-- areas to join laterally and vertically. --

Signed and Sealed this

Twenty-third Day of September, 2003

JAMES E. ROGAN
*Director of the United States Patent and Trademark Office*